United States Patent [19]
Oda

[11] Patent Number: 5,883,433
[45] Date of Patent: Mar. 16, 1999

[54] SEMICONDUCTOR DEVICE HAVING A CRITICAL PATH WIRING

[75] Inventor: Noriaki Oda, Tokyo, Japan

[73] Assignee: NEC Corporation, Tokyo, Japan

[21] Appl. No.: 636,962

[22] Filed: Apr. 24, 1996

[30] Foreign Application Priority Data

Apr. 24, 1995 [JP] Japan .................................. 7-123183

[51] Int. Cl.$^6$ ............................ H01L 23/48; H01L 29/40
[52] U.S. Cl. ........................ 257/750; 257/763; 257/764; 257/765; 257/751; 257/775
[58] Field of Search .................. 257/750–765, 257/775, 773

[56] References Cited

U.S. PATENT DOCUMENTS

| | | | |
|---|---|---|---|
| 5,034,779 | 7/1991 | Tomita et al. ............................ | 257/775 |
| 5,045,916 | 9/1991 | Von et al. ................................ | 257/903 |
| 5,083,188 | 1/1992 | Yamagata ................................ | 257/752 |
| 5,084,412 | 1/1992 | Nakasaki ................................ | 257/762 |
| 5,196,916 | 3/1993 | Ishigami et al. ....................... | 257/769 |
| 5,220,199 | 6/1993 | Owada et al. .......................... | 257/758 |
| 5,294,836 | 3/1994 | Kishi ....................................... | 257/758 |
| 5,309,015 | 5/1994 | Kuwata et al. ......................... | 257/258 |
| 5,317,193 | 5/1994 | Watanabe .............................. | 257/773 |
| 5,321,650 | 6/1994 | Kikuzhi et al. ........................ | 257/370 |
| 5,429,995 | 7/1995 | Nishiyama et al. .................... | 257/760 |
| 5,477,074 | 12/1995 | Yen ....................................... | 257/773 |
| 5,479,053 | 12/1995 | Oda ....................................... | 257/773 |
| 5,500,559 | 3/1996 | Mirata et al. .......................... | 257/764 |
| 5,502,335 | 3/1996 | Oda ....................................... | 257/775 |
| 5,532,516 | 7/1996 | Pasch et al. ........................... | 257/775 |
| 5,604,380 | 2/1997 | Nishmura et al. ..................... | 257/773 |

OTHER PUBLICATIONS

N. Oda et al., "New Wiring Deisgn Concept for Reducing Wiring Resistance Effect in ECL Circuits", IEEE 1990 Bipolar Circuits and Technology Meeting, pp. 140–143.

M. Bohr et al, "A High Performance 0.35 um Logic Technology for 3.3V and 2.5V Operation", IEDM 94, pp. 273–276.

*Primary Examiner*—Alexander Oscar Williams
*Attorney, Agent, or Firm*—Sughrue, Mion, Zinn, Macpeak & Seas, PLLC

[57] ABSTRACT

Disclosed is a semiconductor device, which has: a wiring corresponding to a critical path, a wiring delay time of which determines an operating speed of an entire circuity, and a wiring corresponding to other than the critical path. The critical path wiring the other wiring are formed on the same wiring layer, wherein a thickness of at least a part of the critical path wiring is greater than that of the other wiring.

12 Claims, 11 Drawing Sheets

SEMICONDUCTOR DEVICE HAVING A CRITICAL PATH WIRING

FIELD OF THE INVENTION

This invention relates to a semiconductor device, and more particularly to, a semiconductor device which has a multilayer wiring structure.

BACKGROUND OF THE INVENTION

A conventional semiconductor device with a multilayer wiring structure has been designed to reduce the wiring resistance of a wiring corresponding to a critical path to enhance the operation speed of a circuit. For example, to reduce the wiring resistance to decrease the wiring delay, it is suggested that the wiring width of a critical path is made wider than the wiring other than the critical path. Also, it is suggested that a plurality of via-holes for connecting between two wiring layers which are formed up and down overlapping with each other are provided to give the same potential therebetween to enlarge the effective wiring sectional area.

However, when the wiring width is enlarged as in the former, there is a problem that it obstructs the miniaturization of wiring thereby reducing the integration density. In this case, the critical path may be formed on a top layer where it is relatively easy to obtain a space for forming the wiring pattern. However, the via-holes for electrically conducting to the critical path on the top layer may cause the increase in wiring resistance or limit the wiring design. In addition, when the number of the critical path becomes large, more layers may be required to further increase the number of steps in the process.

On the other hand, when a plurality of wiring layers are arranged to have the same potential as in the latter, the wiring for providing the same potential needs to be formed on the top layer. Therefore, the space to form a wiring pattern on the top layer is thereby limited and the total integration density may be reduced. Further, to form the top layer wiring needs the process by the photolithography with using the same mask pattern as the lower critical path wiring as well as the process for forming the via-holes to electrically conduct these wirings. Thus, the number of steps in the process must be very large.

SUMMARY OF THE INVENTION

Accordingly, it is an object of the invention to provide a semiconductor device in which the wiring resistance of a critical path can be reduced without reducing the integration density.

According to the invention, a semiconductor device, comprises:

a wiring corresponding to a critical path, a wiring delay time of which determines an operating speed of an entire circuit; and, a wiring corresponding to other than the critical path, the critical path wiring and the other wiring being formed on the same wiring layer;

wherein a thickness of at least a part of the critical path wiring is greater than that of the other wiring.

In the semiconductor device according to the invention, since the thickness of the critical path wiring layer is formed to be greater than that of the other wiring layer, the wiring resistance of the critical path can be reduced to shorten the wiring delay time thereof to increase the operating speed of the entire circuit. Therefore, it is not necessary for the width of the wiring corresponding to the critical path to be widened. In addition, the wiring with the same potential does not need to be provided extending to the upper layer. As a result, the wiring pattern layout is not limited and the integration density can be improved.

On the other hand, the semiconductor device according to the invention may be fabricated by a method comprising the steps of:

forming a first wiring layer including a wiring corresponding to a critical path and a wiring other than the critical path;

forming a first layer insulation film to cover the first wiring layer;

forming a first via-hole at a desired position in the first layer insulation film and a groove occupying a predetermined region on the critical path;

burying only the insides of the first via-hole and the groove with a conductive material;

forming a second layer insulation film to cover at least the conductive material;

selectively forming a second via-hole at a desired position in the second layer insulation film;

burying only the inside of the second via-hole with a conductive material; and forming a second wiring layer on the second layer insulation film including the second via-hole.

Here, the above steps of burying the insides of the first and second via-holes and the groove may be performed by forming the conductive material film on the entire surface thereafter polishing the film surface to obtain a flat surface by the chemical and mechanical polishing method, or by growing the conductive material by the selective growth method.

Thus, in the above method for fabricating the semiconductor device, the critical path wiring and the other wiring which have film thicknesses different from each other can be simultaneously formed, thereby simplifying the process.

BRIEF DESCRIPTION OF THE DRAWINGS

The invention will be explained in more detail in conjunction with appended drawings, wherein.

DESCRIPTION OF THE PREFERRED EMBODIMENTS

Before explaining a semiconductor device in the preferred embodiment, the aforementioned conventional semiconductor device will be explained in FIG. 1.

Figure 1:
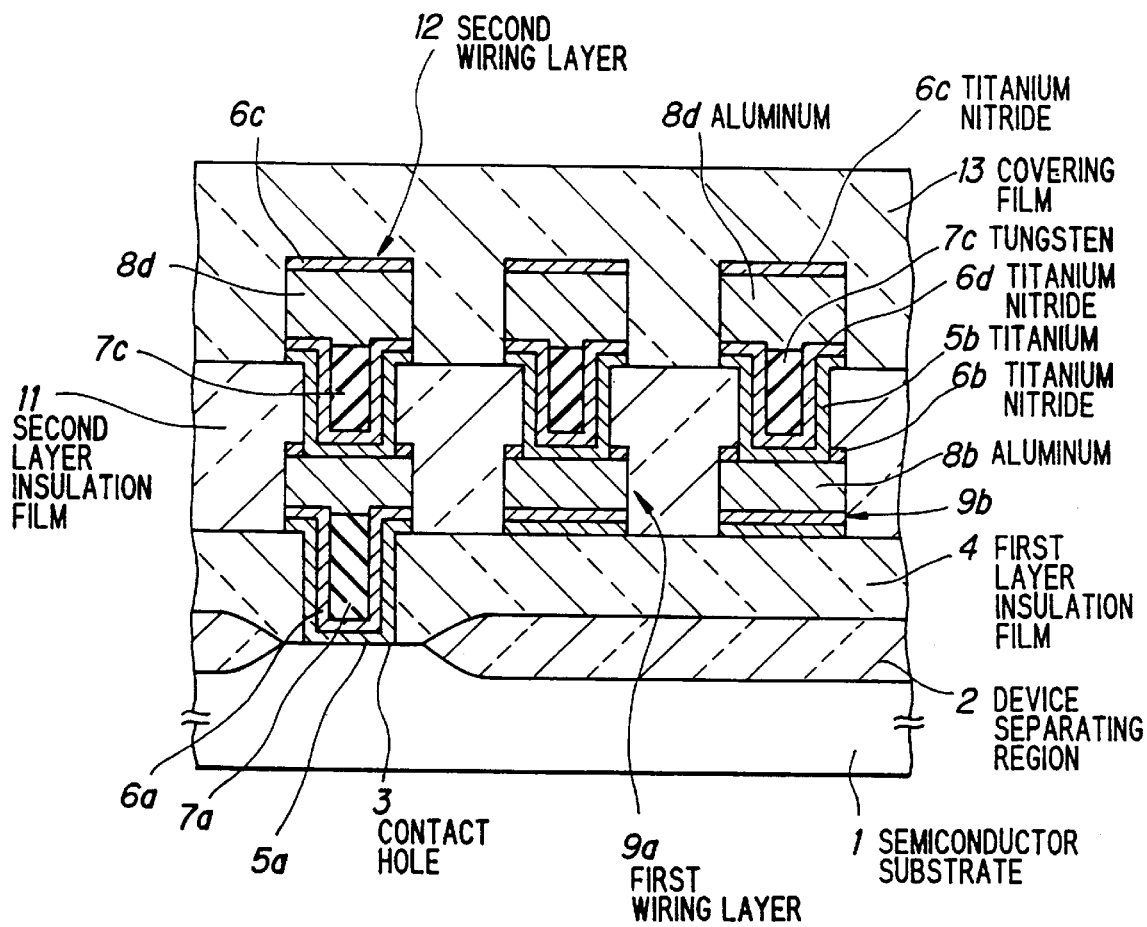
FIG. 1 is a cross sectional view showing a conventional semiconductor device.

As shown in FIG. 1, a first layer insulation film 4 is formed on a semiconductor substrate 1 on which a device separating region 2 is selectively formed. The layer insulation film 4 includes a contact hole 3 which is selectively opened according to a device region.

On the first layer insulation film 4 and inside the contact hole 3, a barrier layer which comprises titanium 5a 600 Å in thickness and titanium nitride 6a 1000 Å in thickness is formed as a wiring pattern. The inside of the contact hole 3 is buried with tungsten 7a. Aluminum 8b is formed on titanium nitride 6a and on tungsten 7a buried in the contact hole 3. Further on there, titanium nitride 6b is formed as a reflection preventing means for preventing the deformation of the pattern due to halation etc. when patterning aluminum by the photolithography. Thus, a first wiring layer 9 comprises titanium 5a, titanium nitride 6a, aluminum 8b and titanium nitride 6b.

Further, a second layer insulation film 11 is formed on the first wiring layer 9. In the second layer insulation film 11, via-holes 10 are opened which electrically conduct selectively to the first wiring layer 9. On the second layer insulation film 11 and inside the via-hole 10, a barrier film which comprises titanium 5b and titanium nitride 6d is formed as a wiring pattern. The inside of the via-hole 10 is buried with tungsten 7c. On titanium nitride 6d and tungsten 7c, aluminum 8d and titanium nitride 6c as a reflection preventing film are formed. Thus, a second wiring layer 12 comprises titanium 5b, titanium nitride 6d, aluminum 8d and titanium nitride 6c. On the second wiring layer 12, a covering film 13 of polyimide or the like is formed.

Figure 2A:
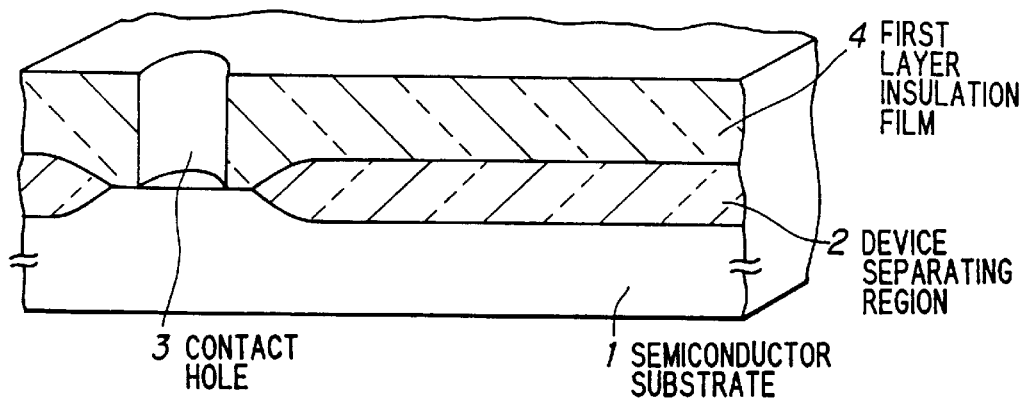
FIGS. 2A to 3 are perspective sectional views showing a method for fabricating the semiconductor device in FIG. 1, FIGS. 4A and 4B are plan views showing a critical path in a conventional semiconductor device.
Figure 2B:
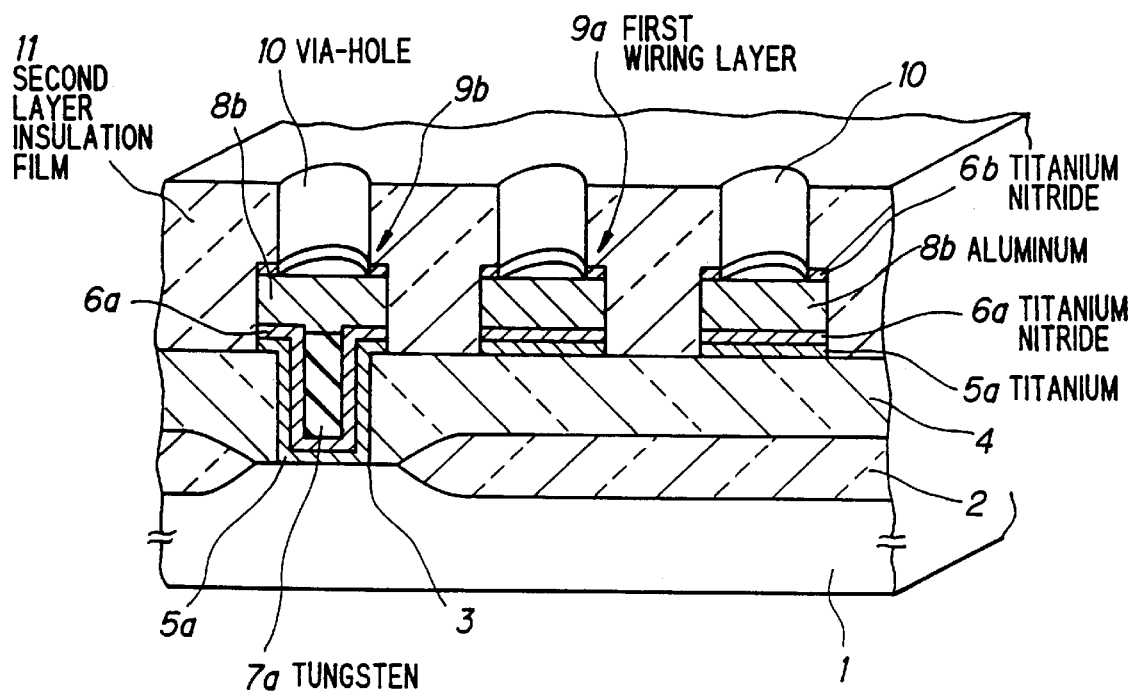
Figure 3:
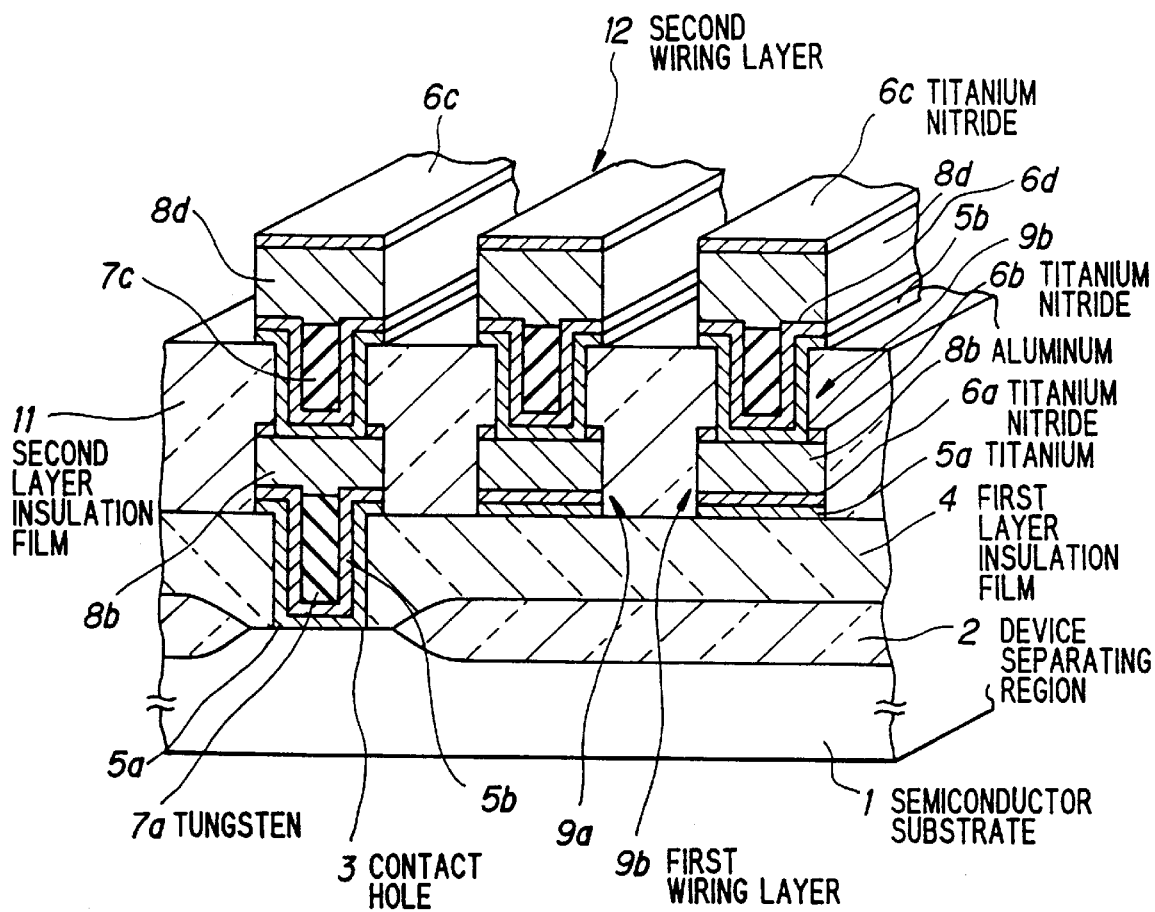

Referring to FIGS. 2A to 3, the method for fabricating the conventional semiconductor device in FIG. 1 will be explained below. First, as shown in FIG. 2A, the device separating region 2 is formed on the semiconductor substrate 1 by the selective oxidation method where a known silicon nitride film is used as a mask against oxidation. Next, the first layer insulation film 4, for example, 8,000 Å in thickness is formed thereon and the contact hole 3 is then opened.

Subsequently, titanium 5a and titanium nitride 6a are formed by sputtering, growing tungsten by the entire surface vapor-phase growth and etching back therein to fill only the inside of the contact hole 3 with tungsten 7a. Then aluminum 8b and titanium nitride 6b are formed on entire surface by sputtering, patterning titanium nitride 6b, aluminum 8b, titanium nitride 6a and titanium 5a by the photolithography and reactive ion etching to form the first wiring layer 9. Further, the second layer insulation film 11 is formed and the via-hole 10 is opened by photolithography and reactive ion etching. Here, titanium nitride 6b inside the via-hole 10 is removed by etching.

Then, as shown in FIG. 3, titanium 5b and titanium nitride 6d are formed on the entire surface by sputtering, growing tungsten on the entire surface by chemical vapor-phase growth and etching back therein to fill only the inside of the via-hole 10 with tungsten 7c. Aluminum 8d and titanium nitride 6c are then formed on the entire surface by sputtering, patterning titanium nitride 6c, aluminum 8d, titanium nitride 6d and titanium 5b by photolithography and reactive ion etching to form the second wiring layer 12. Thereafter, the covering film 13 shown in FIG. 1 is formed.

Here, the film thicknesses of titanium 5a, titanium nitride 6a, aluminum 8b and titanium nitride 6b which compose the first wiring layer 9 are, for example, 600 Å, 1000 Å, 5000 Å and 500 Å, respectively. Aluminum 8b usually includes copper about 0.5% to improve the electromigration durability. To prevent the reaction between aluminum in the first wiring layer and silicon in the semiconductor substrate, aluminum including silicon about 1% may be used.

For example, the first layer insulation film 4 is formed as next. After forming a silicon dioxide film 1000 Å in thickness by the normal pressure CVD method and then forming BPSG(boron-phospho-silicate glass) about 10,000 Å in thickness by the normal pressure CVD method using TEOS (tetraethoxyoxysilane) and oxygen as a material gas, the surface of BPSG is processed by using the SOG(spin-on-glass)-etching-back etc. to obtain the first layer insulation film 4 with a flat surface and the entire thickness of about 8,000 Å.

The film thicknesses of titanium 5b, titanium nitride 6d, aluminum 8d and titanium nitride 6c which compose the second wiring layer 12 are, for example, 300 Å, 1000 Å, 6000 Å and 500 Å, respectively.

For example, the second layer insulation film 11 is formed next. After forming a silicon dioxide film 7,000 Å in thickness by the plasma CVD method, the surface is made flat by the SOG-etching-back method using organic silica or inorganic silica, further forming a silicon dioxide film by the plasma CVD method to obtain a thickness of 8000 Å. For the covering film 13, a silicon dioxide film and plasma SiON film with a thickness of 2,000 Å is provided, for example, by the plasma CVD method.

Figure 4A:
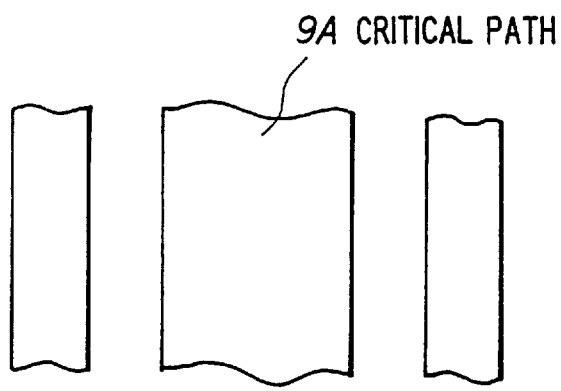
Figure 4B:
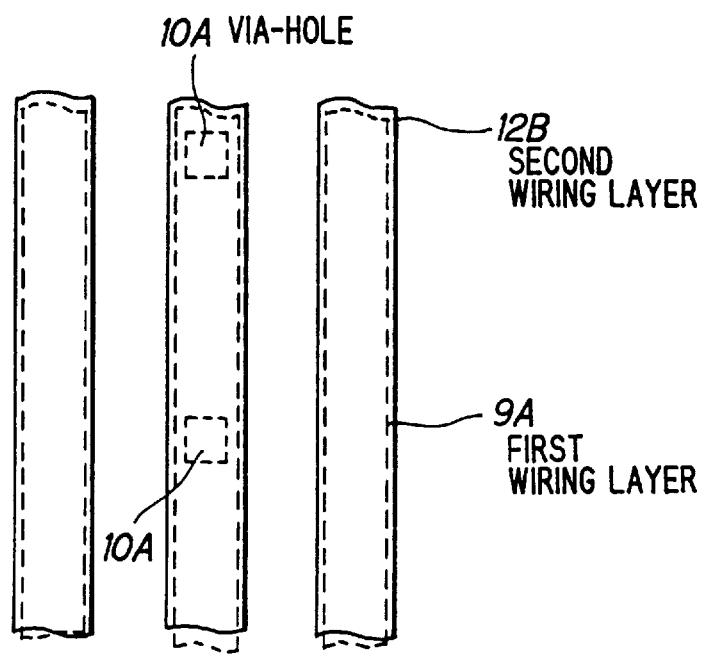

FIGS. 4A and 4B are plan views showing a critical path in a conventional semiconductor device. To reduce the wiring resistance to decrease the wiring delay, the wiring width of a critical path 9A is, as shown in FIG. 4A, made wider than the wiring other than the critical path. On the other hand, a plurality of via-holes 10A for connecting between first wiring layer 9A and second wiring layer 12B which are formed up and down overlapping with each other are, as shown in FIG. 4B, provided to give the same potential therebetween to enlarge the effective wiring sectional area.

Next, a semiconductor device in the first preferred embodiment will be explained in FIG. 5, wherein like parts are indicated by like reference numerals as used in FIG. 1.

Figure 5:
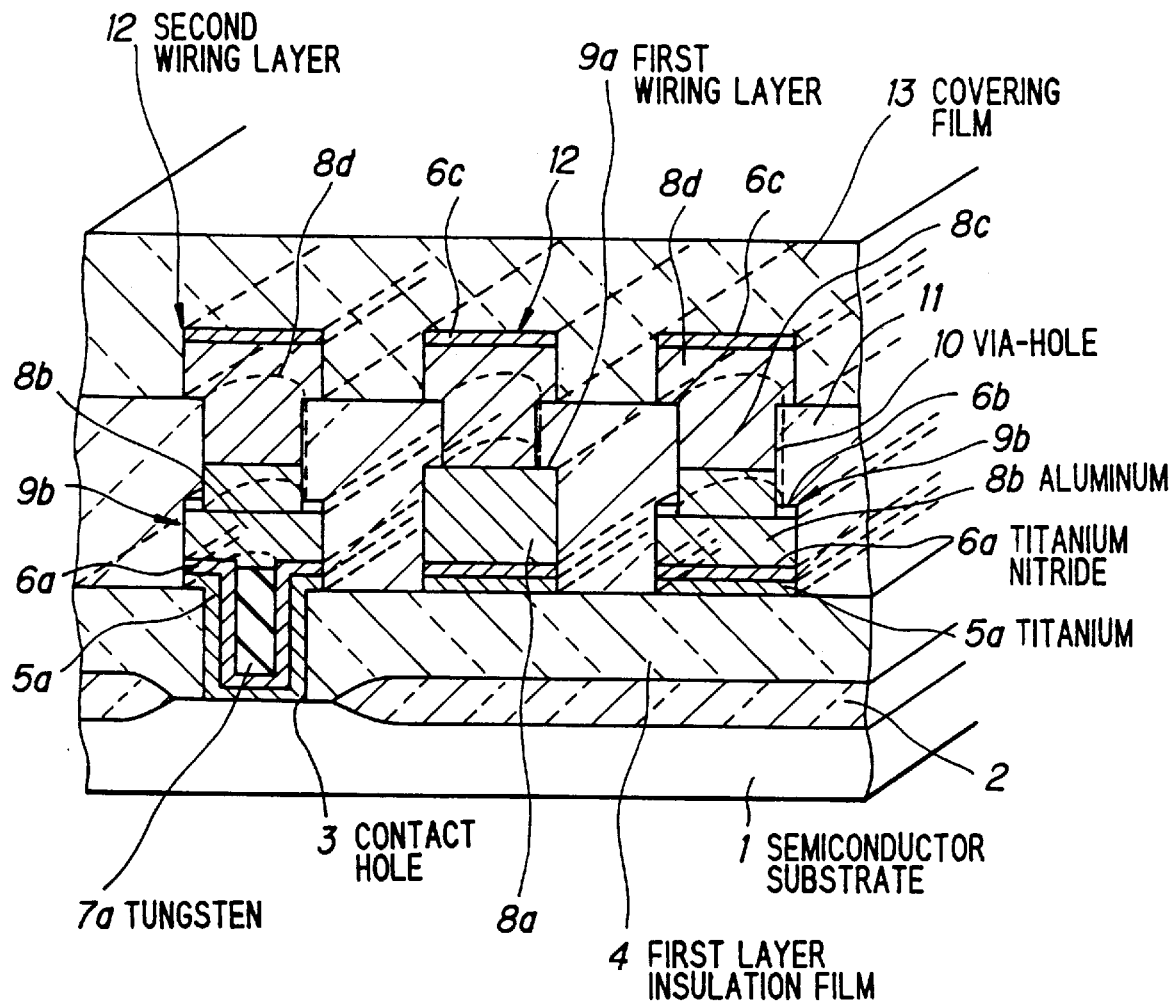
FIG. 5 is a perspective sectional view showing a semiconductor device in a first preferred embodiment according to the invention.

As shown in FIG. 5, a first layer insulation film 4 with a thickness of about 8000 Å is formed on a semiconductor substrate 1 on which a device separating region 2 is selectively formed. The layer insulation film 4 includes a contact hole 3 which is selectively opened according to a device region. On the first layer insulation film 4 and inside the contact hole 3, a barrier layer is formed which comprises titanium 5a 600 Å in thickness and titanium nitride 6a 1000 Å in thickness. The inside of the contact hole 3 is filled with tungsten 7a. In the region including the barrier layer and the contact hole 3, first wiring layers 9a, 9b are selectively formed.

Here, the first wiring layer 9a corresponds to a wiring (critical path) in which a wiring delay time thereof determines the operating speed of the entire circuit in operation. It comprises titanium 5a, titanium nitride 6a and aluminum 8a about 8000 Å in thickness. The first wiring layer 9b corresponds to a wiring other than the critical path, which comprises titanium 5a, titanium nitride 6a, aluminum 8b about 4000 Å in thickness and titanium nitride 6b about 500 Å in thickness. Thus, the thickness of the first wiring layer 9a corresponding to the critical path is arranged to be greater than that of the first wiring layer 9b to corresponding to a wiring other than the critical path.

Further, a second layer insulation film 11 is formed to cover the first wiring layers 9a and 9b. In the second layer insulation film 11, via-holes 10 are opened which electrically conducts selectively to the first wiring layer. The inside of the via-hole 10 is buried with aluminum 8c. A second wiring layer 12 is formed on the second layer insulation film 11 including the via-hole 10. The thickness of the second layer insulation film 11 is arranged to be about 8000 Å on the first wiring layer 9a of the critical path.

The second wiring layer 12 comprises aluminum 8d 6000 Å in thickness and titanium nitride 6c 500 Å in thickness. A covering film 13 is formed to cover the entire surface including on the second wiring layer 12.

In this structure, since the thickness of the first wiring layer 9a corresponding to the critical path is arranged to be greater than that of the other wiring layer 9b, the wiring resistance of the critical path can be reduced to shorten the wiring delay time thereof to increase the operating speed of the entire circuit. Therefore, it is not necessary for the width of the wiring corresponding to the critical path to be widened. In addition, the wiring with the same potential does not need to be provided extending to the upper layer. As a result, the wiring pattern layout is not limited and the integration density can be improved.

Meanwhile, even when the critical path wiring is made thicker than the other wiring, a stepped portion does not occur on the surface of the layer insulation film since the top surface of the first layer insulation film 4 is formed to be flat. Namely, there is no problem that the upper wiring may have a stepped portion.

Figure 6A:
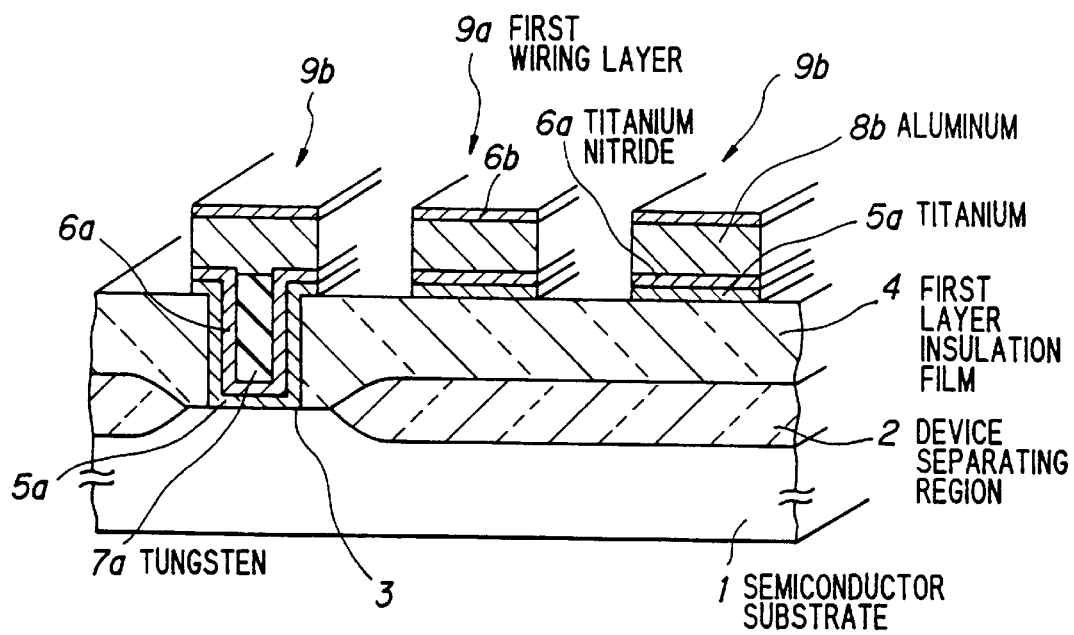
FIGS. 6A to 7B are perspective sectional views showing a method for fabricating the semiconductor device in FIG. 5.

Referring to FIGS. 6A to 7B, the method for fabricating the semiconductor device in the first embodiment will be explained below. First, as shown in FIG. 6A, the device separating region 2 is formed on the semiconductor substrate 1 by the selective oxidation method where a standard silicon nitride film is used as a mask against oxidation. Then a desired device is formed in a device region sectioned thereby. Next, the first layer insulation film 4 is formed flat on the semiconductor substrate 1 and the contact hole 3 is then opened at a desired position by using photolithography and reactive ion etching.

The first layer insulation film 4 is formed next. After forming a silicon dioxide film 1500 Å in thickness, for example, by the normal pressure CVD method and then forming BPSG to a thickness of about 10,000 Å by the normal pressure CVD method using TEOS and ozone($O_3$) as a material gas, the surface of BPSG is polished by using CMP to obtain a flat surface and the entire thickness of about 8000 Å of the first layer insulation film 4.

Subsequently, titanium 5a and titanium nitride 6a are formed by sputtering, growing tungsten by the entire surface vapor-phase growth and etching back therein to fill only the inside of the contact hole 3 with tungsten 7a. Then aluminum 8b and titanium nitride 6b 4000 Å, 5000 Å in thickness, respectively are formed by sputtering, with patterning by photolithography and reactive ion etching to form the first wiring layers 9a and 9b. Here, the first wiring layer 9a corresponds to the critical path, only a part of which is formed at this stage. The first wiring layer 9b corresponds to the other path.

Figure 6B:
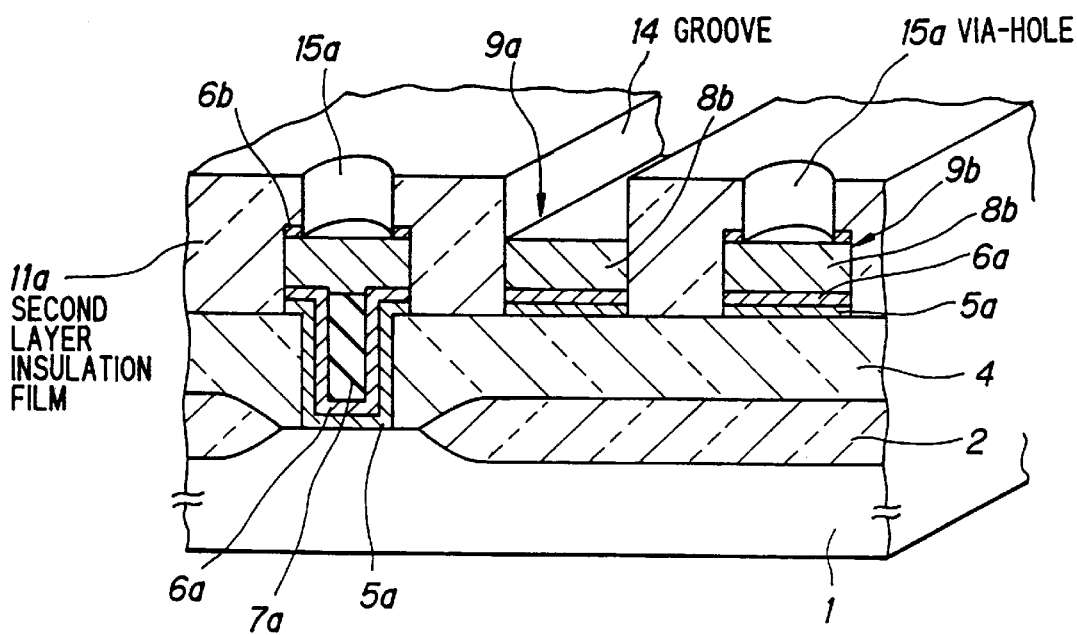

Then, as shown in FIG. 6B, the second layer insulation film 11a is formed flat to cover the first layer insulation film 4 and first wiring layers 9a, 9b. The second layer insulation film 11a on the first wiring layer 9a corresponding to the critical path is removed to form a groove 14, by photolithography and the reactive ion etching using $CF_4$ as a material gas. Simultaneously, the lower half 15a of the via-hole is opened at a desired position on the first wiring layer 9b other than the critical path. Herein, the groove 14 and the lower half 15a of the via-hole are deeply formed such that they penetrate titanium nitride 6b on the first wiring layers 9a, 9b.

Figure 7A:
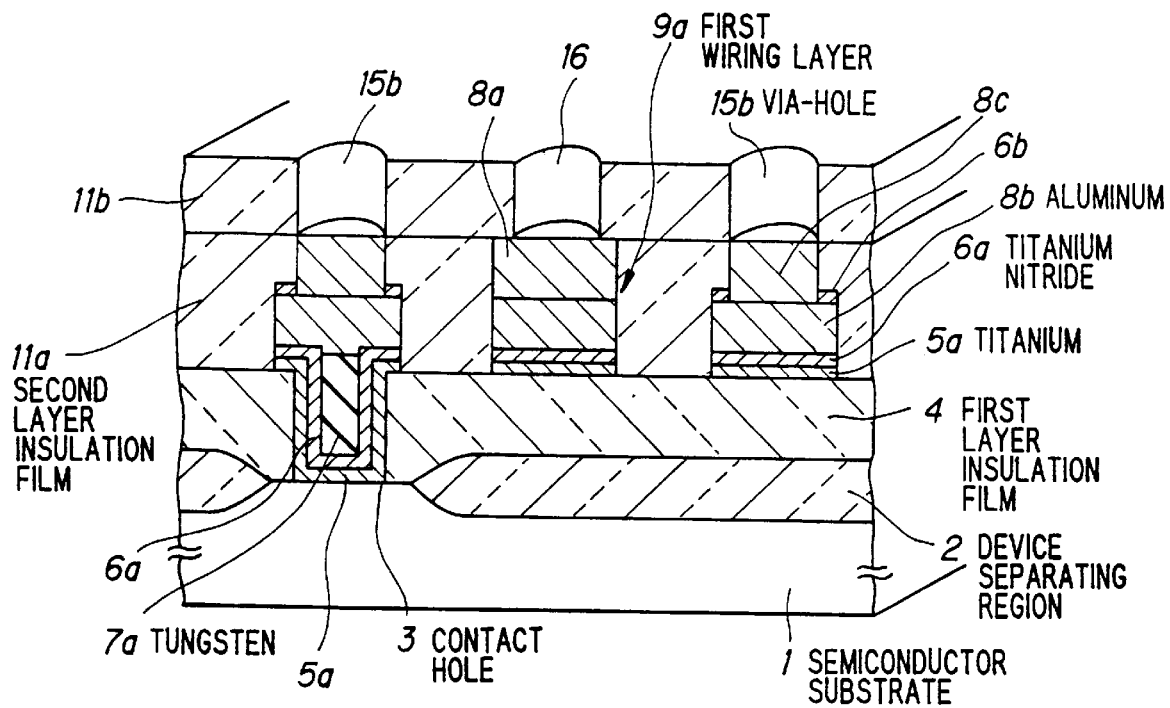

Next, as shown in FIG. 7A, by the chemical vapor-phase growth using tetramethylaluminum(TMA) as a material gas, aluminum 8c is grown on the entire surface to be buried into the groove 14 and lower half 15a of the via-hole. Thereafter, chemical and mechanical polishing(CMP) is carried out such that only the inside of the groove 14 and lower half 15a of the via-hole is filled with aluminum 8c. Further, the second layer insulation film 11b is formed on the entire surface, thereafter opening a via-hole 16 to be connected with the critical path and the upper half 15b of the via-hole to be communicated with the lower half 15a of the via-hole by photolithography and the reactive ion etching.

Figure 7B:
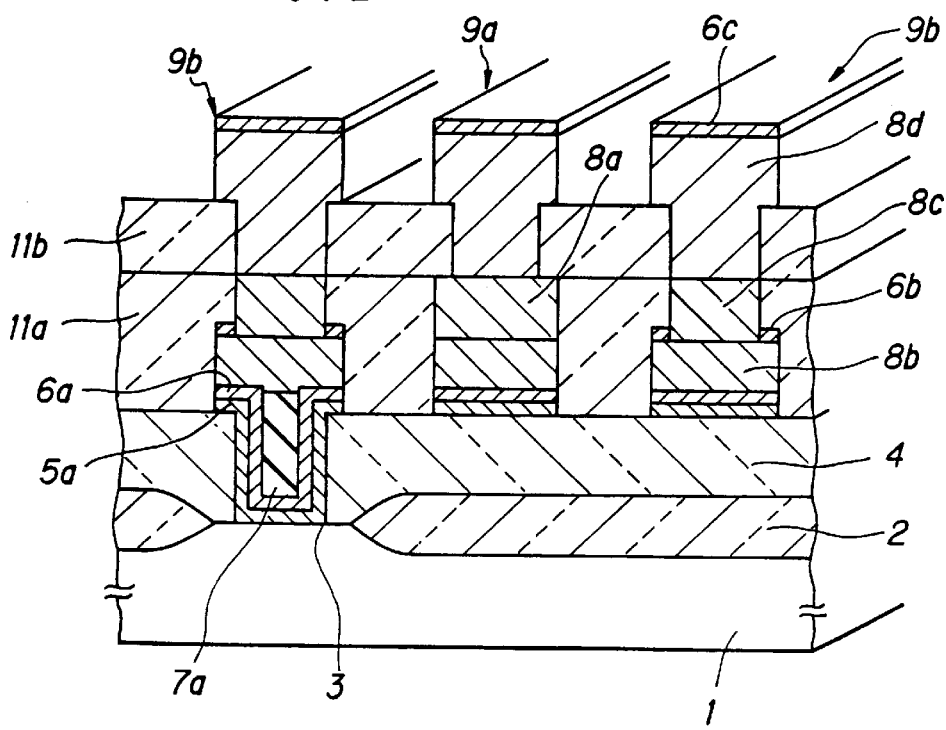

Thereafter, as shown in FIG. 7B, aluminum 8d about 10000 Å in thickness is formed by CVD, then polished by CMP to be left only inside the via-holes 16 and 15b. Titanium nitride 6c is then formed by sputtering, and thereafter patterned it by photolithography and reactive ion etching to form the second wiring layer 12. Finally, the covering film 13 is formed to obtain the structure shown in FIG. 5.

Then second layer insulation film 11 is formed next. After forming a silicon dioxide film 10000 Å in thickness, for example, by the plasma CVD method using TEOS as a material gas, the surface is polished to obtain a thickness of 4000 Å on the first wiring layer 9b by using CMP to form the lower half 11a of the second layer insulation film 11. The upper half 11b of the second layer insulation film 11 is formed to obtain a thickness of about 8000 Å on the first wiring layer 9a corresponding to the critical path by the plasma CVD method using TEOS as a material gas. Herein, the lower surface of the second layer insulation film 11b is made so sufficiently flat that it is not necessary to flatten the surface of the second layer insulation film 11b after forming it.

In accordance with the above process, the first wiring layer 9a corresponding to the critical path and the first wiring layer 9b corresponding to the other path as shown in FIG. 5 can be simultaneously formed and the wiring thickness of the critical path can be formed to be greater than that of the other path. In addition, as compared with the conventional method for fabricating the semiconductor device as shown in FIG. 1, this process can be performed merely by requiring additional one step for photolithography. Namely, the process is not complicated compared to the conventional process that the wiring with the same potential needs to be provided extending to the upper layer as shown in FIG. 4B.

Figure 8:
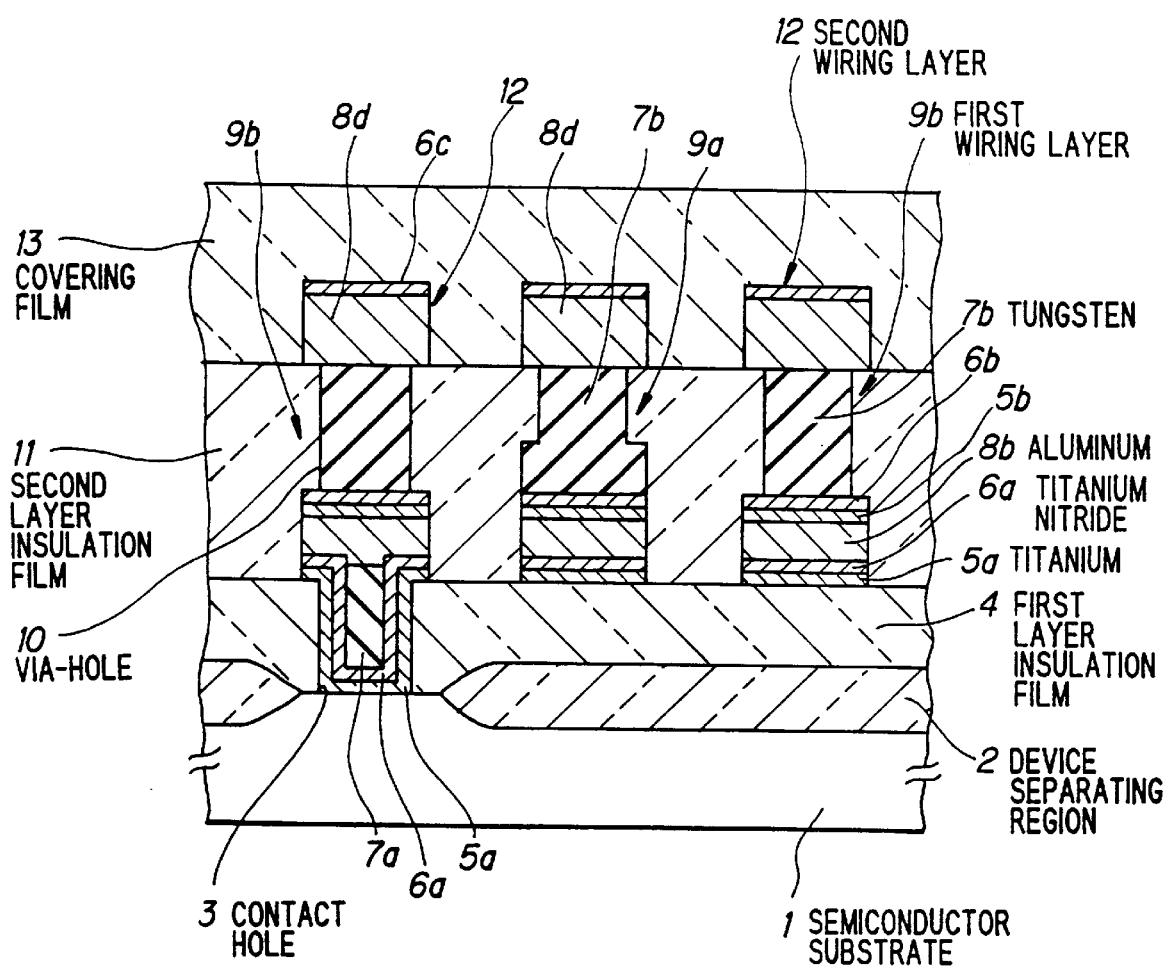
FIG. 8 is a cross sectional view showing a semiconductor device in a second preferred embodiment according to the invention.

A semiconductor device in the second preferred embodiment will be explained in FIG. 8, wherein like parts are indicated by like reference numerals as used in FIG. 5.

The structure of the semiconductor device in the second embodiment is different from that in the first embodiment as shown in FIG. 5 in that: a material buried in the via-hole 10 is tungsten 7b; the first wiring layer 9b has a five-layer structure comprising titanium 5a, titanium nitride 6a, aluminum 8b, titanium 5b and titanium nitride 6b; the first wiring layer 9a corresponding to the critical path has a six-layer structure comprising titanium 5a, titanium nitride 6a, aluminum 8b, titanium 5b, titanium nitride 6b and tungsten 7b; and titanium nitride 6b and titanium 5b is left at the bottom of the via-hole 10 on the wiring corresponding to the path other than the critical path.

Also in the second embodiment, since the thickness of the first wiring layer 9a corresponding to the critical path is arranged to be greater than that of the other wiring layer 9b, the wiring resistance of the critical path can be reduced to shorten the wiring delay time thereof to increase the operating speed of the entire circuit. Therefore, it is not necessary for the width of the wiring corresponding to the critical path to be widened. In addition, the wiring with the same potential does not need to be provided extending to the upper layer. As a result, the wiring pattern layout is not limited and the integration density can be improved.

On the other hand, in the second embodiment, the wiring corresponding to the critical path includes aluminum 8b and tungsten 7c. Therefore, though the wiring resistance is not so reduced as in the first embodiment, the number of steps in CMP can be decreased.

Figure 9A:
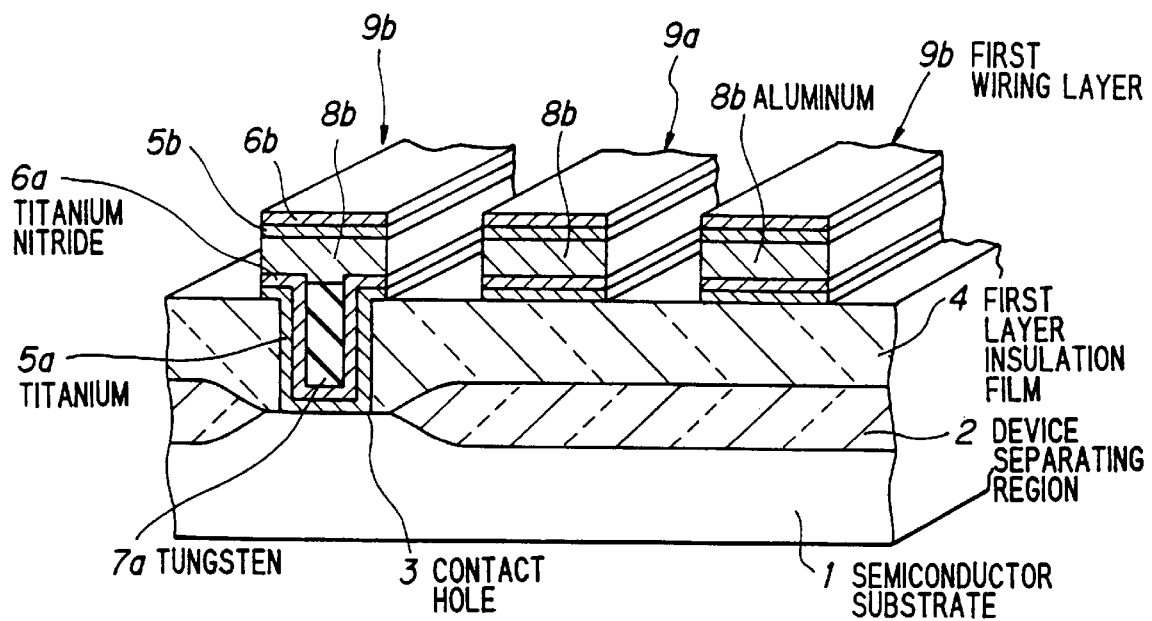
FIGS. 9A to 10B are perspective sectional views showing a method for fabricating the semiconductor device in FIG. 8.

Referring to FIGS. 9A to 10B, the method for fabricating the semiconductor device in the second embodiment will be explained below. First, as shown in FIG. 9A, the device separating region 2 is formed on the semiconductor substrate 1 by the selective oxidation method where a standard silicon nitride film is used as a mask against oxidation. Next, the first layer insulation film 4 is formed thereon and the contact hole 3 is then opened at a desired position by using photolithography and reactive ion etching. Then, titanium 5a and titanium nitride 6a are formed by sputtering, growing tungsten on the entire surface by CVD and etching back therein to fill only the inside of the contact hole 3 with tungsten 7a.

Further, aluminum 8b and titanium 5b and titanium nitride 6b are formed by sputtering, patterning by photolithography and patterning reactive ion etching to form the first wiring layers 9a and 9b. Here, the first wiring layer 9a corresponds to the critical path, and the first wiring layer 9b corresponds to the other path. The film thicknesses of titanium 5a, titanium nitride 6a, aluminum 8b, titanium 5b and titanium nitride 6b which compose the first wiring layer are 600 Å, 1000 Å, 4500 Å, 200 Å and 500 Å, respectively.

Figure 9B:
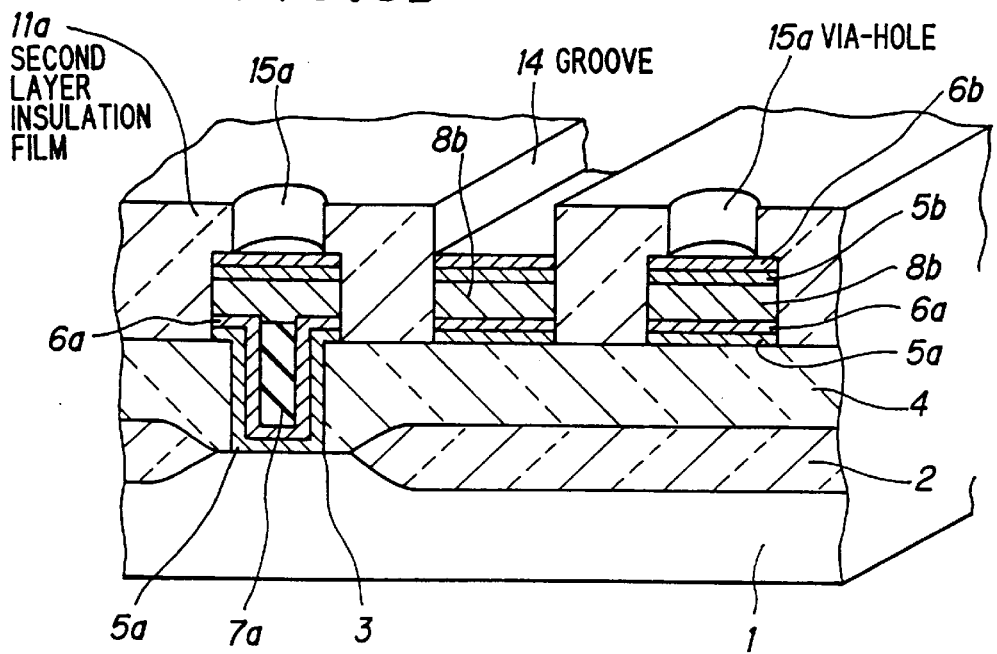

As shown in FIG. 9B, the second layer insulation film 11a is then formed flat. The second layer insulation film 11a on the first wiring layer 9a corresponding to the critical path is removed to form a groove 14, by photolithography and the reactive ion etching using $CF_4$, $CHF_3$ as a material gas. Simultaneously, the lower half 15a of the via-hole is opened on the first wiring layer 9b other than the critical path. Herein, the groove 14 and the lower half 15a of the via-hole are etched to stop at titanium nitride 6b not to penetrate through titanium 5b on the first wiring layers 9a, 9b.

Figure 10A:
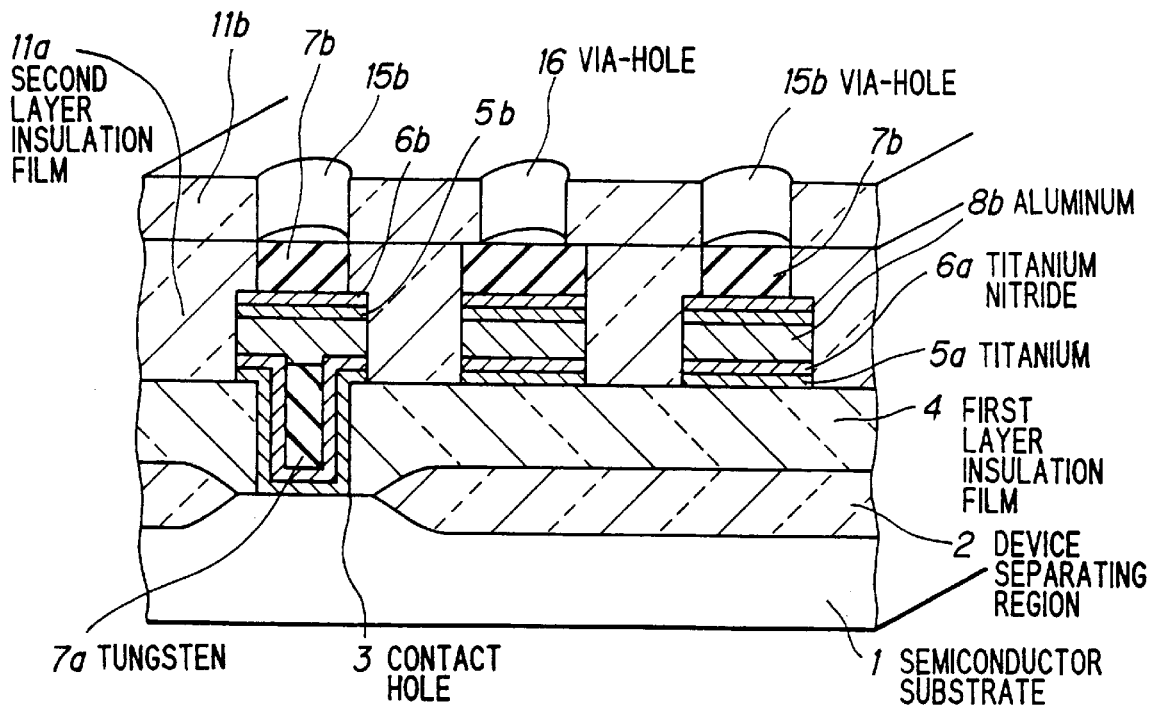

Next, as shown in FIG. 10A, by the selective CVD using $WF_6$ as a material gas, tungsten 7b is formed such that it is left only inside of the groove 14 and lower half 15a of the via-hole. Further, the second layer insulation film 11b is formed on the entire surface, thereafter opening a via-hole 16 the upper half 15b of the via-hole by the photolithography and the reactive ion etching.

Figure 10B:
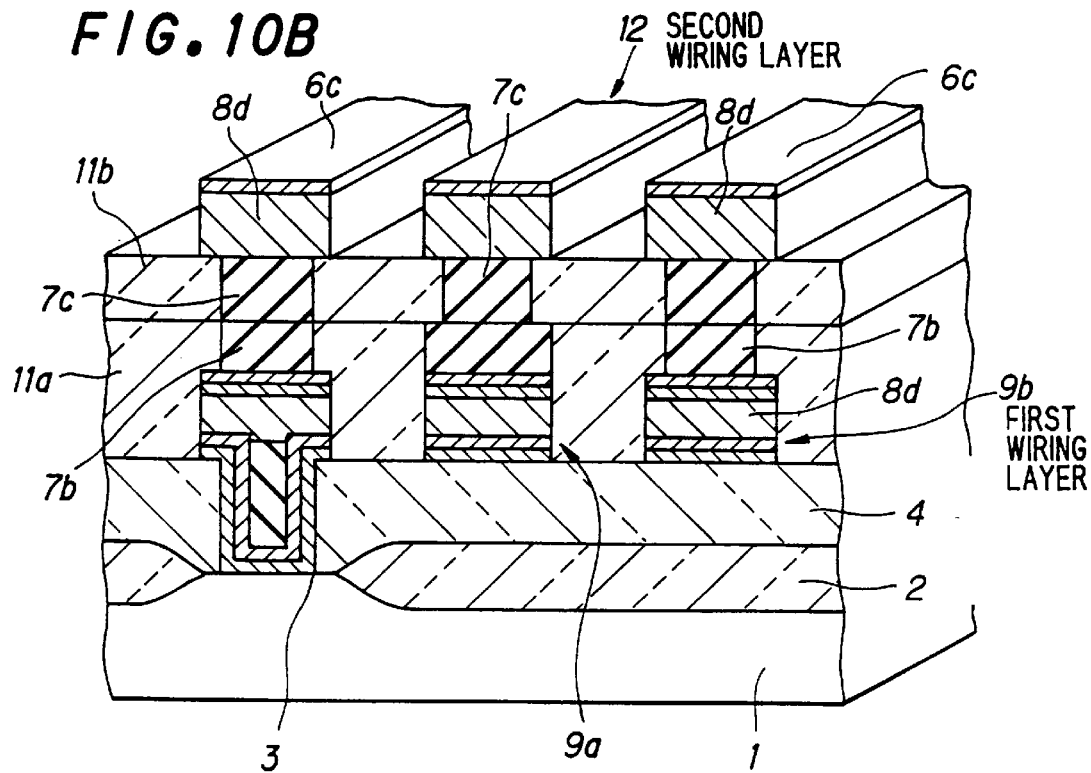

As shown in FIG. 10B, tungsten 7c is then formed only inside of the upper half 15b again by the selective CVD using $WF_6$ as a material gas, thereafter forming aluminum 8d and titanium nitride 6c thereon by sputtering, patterning it by photolithography and the reactive ion etching to form the second wiring layer 12 comprising aluminum 8d and titanium nitride 6c. Finally, the covering film 13 is formed to obtain the structure shown in FIG. 8.

Here, the second layer insulation film 11 is formed next. After forming a silicon dioxide film 10000 Å in thickness, for example, by the plasma CVD method using TEOS as a material gas, the surface is polished to obtain a thickness of 4000 Å on the first wiring layer 9b by using CMP to form the lower half 11a of the second layer insulation film 11. The upper half 11b of the second layer insulation film 11 is formed to obtain a thickness of about 8000 Å on the first wiring layer 9a corresponding to the critical path by the plasma CVD method using TEOS as a material gas.

In accordance with the above process, since the inside of the groove 14 and the lower and upper halves 15a, 15b of the via-hole is selectively buried with tungsten, the number of steps in CMP can be decreased to one, i.e., two times less than that in the first embodiment, to provide a high throughput. The reason why titanium 6b is to be left when opening the lower half 15a and groove 14 is that aluminum 8b can be prevented from corrosion when selectively growing tungsten. The reason why titanium 5b is inserted between aluminum 8b and titanium nitride 6b is that the high resistance due to the nitrification of the surface of aluminum 8b when sputtering titanium nitride 6b can be avoided.

In accordance with the above process, the first wiring layer 9a corresponding to the critical path and the first wiring layer 9b corresponding to the other path can be simultaneously formed and the wiring thickness of the critical path can be formed to be greater than that of the other path. In addition, as compared with the conventional method for fabricating the semiconductor device as shown in FIG. 1, this process can be performed only by requiring additional one step for the photolithography. Namely, the process is not complicated comparison with the conventional process in which the wiring with the same potential needs to be provided extending to the upper layer. Furthermore, as explained previously, the number of steps in CMP can be decreased comparison with that in the first embodiment.

Figure 11:
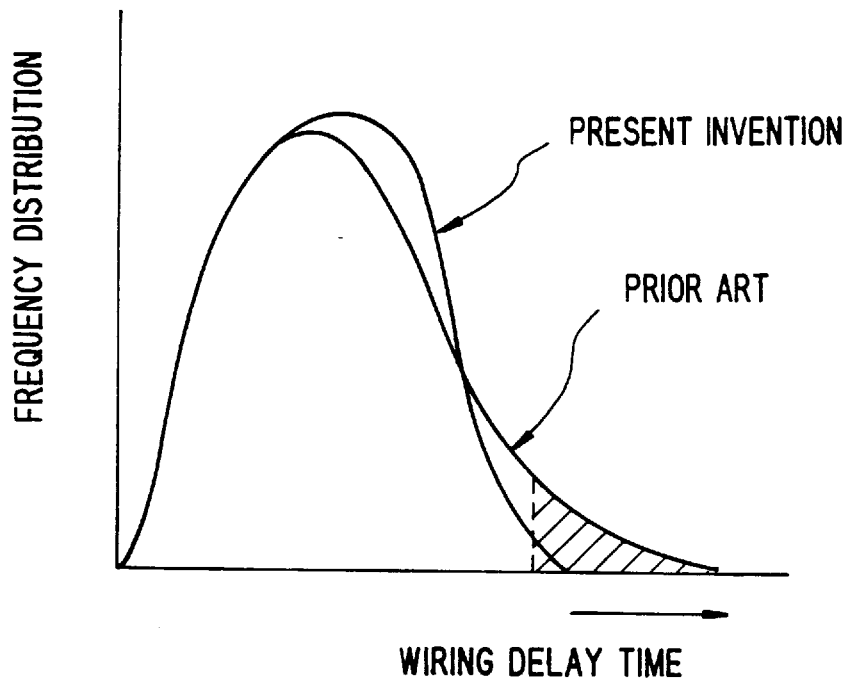
FIG. 11 shows the comparison regarding frequency distribution of wiring delay time between a semiconductor device of the present invention and that of prior art.

FIG. 11 shows the comparison regarding frequency distribution of wiring delay time between a semiconductor device of the present invention and that of prior art. In FIG. 11, oblique lines correspond to a wiring with a long wiring delay time. In accordance with the present invention, it is proved that the film thickness of the portion corresponding to the long wiring delay time can be made two times thick to reduce the wiring delay time.

In the above embodiments of the invention, shown herein have been the example where the number of wiring layers is two and only one wiring layer has a thickness different from the others. However, the number of wiring layers may be increased as desired by providing a multilayer structure constructed repeatedly. On the other hand, in the above embodiments, tungsten or aluminum is filled into the via-hole before forming the second wiring layer. However, when a flat upper surface is not required as in the case that the second wiring layer is formed as a top layer, a part of the second wiring layer may be formed to extend to the inside of the via-hole to electrically conduct to the first wiring layer.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device having at least one wiring layer, comprising:
    a critical path wiring corresponding to a critical path, a wiring delay time of which determines an operating speed of an entire circuit, formed on said at least one wiring layer; and
    other path wiring corresponding to other than said critical path wiring said other path wiring formed on said at least one wiring layer, wherein a thickness of at least a part of said critical path wiring in said at least one wiring layer is greater than that of said other wiring in said at least one wiring layer;

an upper wiring layer formed to overlap said critical path wiring and said other path wiring;

at least one via-hole formed between said upper wiring layer and said lower wiring layer, including said critical path wiring and said other path wiring, such that said upper wiring layer and said lower wiring layer are electrically connected by a conductive material buried in said at least one via-hole.

2. A semiconductor device, according to claim 1, wherein:

said critical path wiring comprises a first layer and a second layer formed on said first layer; and said other wiring comprises said first layer.

3. A semiconductor device, according to claim 2, wherein:

said first layer is made of the same conductive material as said second layer.

4. A semiconductor device, according to claim 2, wherein:

said first layer is made of a conductive material different from said second layer.

5. A semiconductor device, according to claim 2, further comprising:

an upper wiring layer formed to overlap said critical path wiring and said other path wiring; and at least one via-hole formed between said upper wiring layer and said at least one wiring layer including said critical path wiring and said other path wiring;

wherein said upper wiring layer and said at least one wiring layer are electrically connected by a conductive material buried in said at least one via-hole.

6. A semiconductor device, according to claim 1, wherein:

said buried conductive material is composed of a part of said upper wiring layer which is formed to be buried into said at least one via-hole.

7. A semiconductor device, according to claim 5, wherein:

said buried conductive material is composed of a part of said upper wiring layer which is formed to be buried into said at least one via-hole.

8. A semiconductor device, comprising:

a critical path wiring corresponding to a critical path, a wiring delay time of which determines an operating speed of an entire circuit, said critical path wiring formed in a lower wiring layer;

other path wiring corresponding to other than said critical path, formed in said lower wiring layer, having a thickness such that said critical path wiring is thicker than said other path wiring in said lower wiring layer;

an upper wiring layer formed to overlap said critical path wiring and said other path wiring;

at least one via-hole formed between said upper wiring layer and said lower wiring layer, including said critical path wiring and said other path wiring, such that said upper wiring layer and said lower wiring layer are electrically connected by a conductive material buried in said at least one via-hole.

9. A semiconductor device having at least one wiring layer, comprising:

a critical path wiring corresponding to a critical path, a wiring delay time of which determines an operating speed of an entire circuit, formed on said at least one wiring layer; and other path wiring corresponding to other than said critical path said other path wiring formed on said at least one wiring layer;

wherein a thickness of at least a part of said critical path wiring in said at least one wiring layer is greater than that of said other wiring in said at least one wiring layer and where said at least one wiring layer makes electrical contact through a contact hole in an underlying insulating layer to a semiconductor substrate.

10. A semiconductor device, according to claim 1, wherein:

said critical path wiring comprises a first layer and a second layer formed on said first layer; and said other wiring comprises said first layer.

11. A semiconductor device, according to claim 2, wherein:

said first layer is made of the same conductive material as said first layer.

12. A semiconductor device, according to claim 2, wherein:

said first layer is made of a conductive material different from said first layer.

* * * * *